US012750033B2

(12) United States Patent
Zhang et al.

(10) Patent No.: US 12,750,033 B2
(45) Date of Patent: Sep. 29, 2026

(54) FILM BULK ACOUSTIC RESONATOR

(71) Applicant: AAC Technologies (Nanjing) Co., Ltd., Nanjing (CN)

(72) Inventors: Zhang Zhang, Nanjing (CN); Shuai Yang, Nanjing (CN); Ke Wu, Nanjing (CN); Zhiqiang Zhuang, Nanjing (CN); Lirong Zhang, Nanjing (CN); Chao Wang, Nanjing (CN)

(73) Assignee: AAC Technologies (Nanjing) Co., Ltd., Nanjing (CN)

( * ) Notice: Subject to any disclaimer, the term of this patent is extended or adjusted under 35 U.S.C. 154(b) by 638 days.

(21) Appl. No.: 18/457,320

(22) Filed: Aug. 28, 2023

(65) Prior Publication Data

US 2024/0267025 A1 Aug. 8, 2024

Related U.S. Application Data

(63) Continuation of application No. PCT/CN2023/085895, filed on Apr. 3, 2023.

(30) Foreign Application Priority Data

Feb. 2, 2023 (CN) ......................... 202310073325.1

(51) Int. Cl.
*H03H 9/02* (2006.01)
*H03H 9/13* (2006.01)
*H03H 9/17* (2006.01)

(52) U.S. Cl.
CPC ........ *H03H 9/173* (2013.01); *H03H 9/02157* (2013.01); *H03H 9/13* (2013.01)

(58) Field of Classification Search
CPC ....... H03H 9/13; H03H 9/173; H03H 9/02157
See application file for complete search history.

(56) References Cited

U.S. PATENT DOCUMENTS 6,870,446 B2 * 3/2005 Ohara .................. H03H 9/0095
333/191

* cited by examiner

*Primary Examiner* — Emily P Pham
*Assistant Examiner* — Monica Mata
(74) *Attorney, Agent, or Firm* — Wiersch Law Group

(57) ABSTRACT

The present invention provides a FBAR, which includes a substrate, an acoustic reflector, a first electrode, a piezoelectric layer, a second electrode, and an etch-stop layer. The acoustic reflector is arranged on the substrate, the first electrode is arranged on a side of the substrate and covers the acoustic reflector, and at least a part of the piezoelectric layer is arranged on a side of the first electrode away from the substrate. The second electrode is arranged on a side of the piezoelectric layer away from the first electrode, and the etch-stop layer is arranged on a side of the second electrode away from the piezoelectric layer. The FBAR further includes at least two stacked components. At least an edge of each of the at least two stacked components is misaligned. The quality factor of the FBAR in the present invention is relatively high.

10 Claims, 18 Drawing Sheets

FILM BULK ACOUSTIC RESONATOR

TECHNICAL FIELD

The present invention relates to the technical field of resonators, in particular to a film bulk acoustic resonator (FBAR).

BACKGROUND

With the development of thin film and micro nano manufacturing technology, electronic devices are rapidly developing towards miniaturization, high density reuse, high frequency, and low power consumption. A FBAR, which has developed in recent years, is an advanced resonant technology that converts electrical energy into sound waves through the inverse piezoelectric effect of piezoelectric thin films to form resonance. However, the FBAR in the conventional art can only reflect the specific mode wave energy of the transverse Rayleigh Lamb (RL) wave, and have poor reflection effect on other mode wave energy, resulting in energy leakage. Therefore, the quality factor (Q value) of the FBAR in the conventional art is relatively low.

SUMMARY

A FBAR is provided according to the present invention, and the FBAR has a high Q value.

The present invention provides a FBAR, which includes a substrate, an acoustic reflector, a first electrode, a piezoelectric layer, a second electrode, and an etch-stop layer, where the acoustic reflector is arranged on the substrate, the first electrode is arranged on a side of the substrate and covers the acoustic reflector, and at least a part of the piezoelectric layer is arranged on a side of the first electrode away from the substrate. The second electrode is arranged on a side of the piezoelectric layer away from the first electrode, and the etch-stop layer is arranged on a side of the second electrode away from the piezoelectric layer. The FBAR further includes at least two stacked components arranged on a side of the etch-stop layer away from the second electrode, each of the at least two stacked components is a frame structure, and each of the at least two stacked components includes a mass load layer and an insertion layer stacked sequentially. At least an edge of each of the at least two stacked components is misaligned along a direction perpendicular to thickness direction of the FBAR. In this way, the mass load layer of at least two stacked components is enabled to reflect at least two of a S0 mode wave, a S1 mode wave, an A0 mode wave, and an A1 mode wave in the transverse RL wave. The FBAR of the present invention can reflect more wave energy than the FBAR in the conventional art, which means the FBAR of the present invention has a higher quality factor.

As an improvement, an effective source region of the FBAR is formed by an overlapping region of the first electrode, the piezoelectric layer, the second electrode, and the etch-stop layer along the direction perpendicular to thickness direction of the FBAR. At least a part of the at least two stacked components is located within the effective source region, and are located close to an edge of the effective source region.

As an improvement, at least one of the at least two stacked components further includes an extension structure extending along the direction perpendicular to thickness direction of the FBAR and at least partially located outside the effective source region.

As an improvement, widths of the at least two stacked components have a same width or have different widths along the direction perpendicular to thickness direction of the FBAR.

As an improvement, a width of the mass load layer along the direction perpendicular to thickness direction of the FBAR ranges from 0.5 μm to 8 μm.

As an improvement, a thickness of the insertion layer along the direction perpendicular to thickness direction of the FBAR ranges from 0.01 μm to 0.2 μm.

As an improvement, the mass load layer has greater acoustic impedance than the insertion layer.

As an improvement, the acoustic reflector is a cavity formed on a side of the substrate close to the first electrode, or the acoustic reflector is a cavity formed inside the substrate.

As an improvement, a projection of the first electrode on the substrate is at least partially located outside the cavity along the direction perpendicular to thickness direction of the FBAR, the, and a projection of the second electrode on the substrate is located within the cavity.

As an improvement, material of the mass load layer includes at least one of aluminum (Al), molybdenum (Mo), tungsten (W), and ruthenium (Ru). And/or, material of the insertion layer includes at least one of aluminum nitride (AlN) and silicon nitride ($Si_3N_4$).

Figure 1:
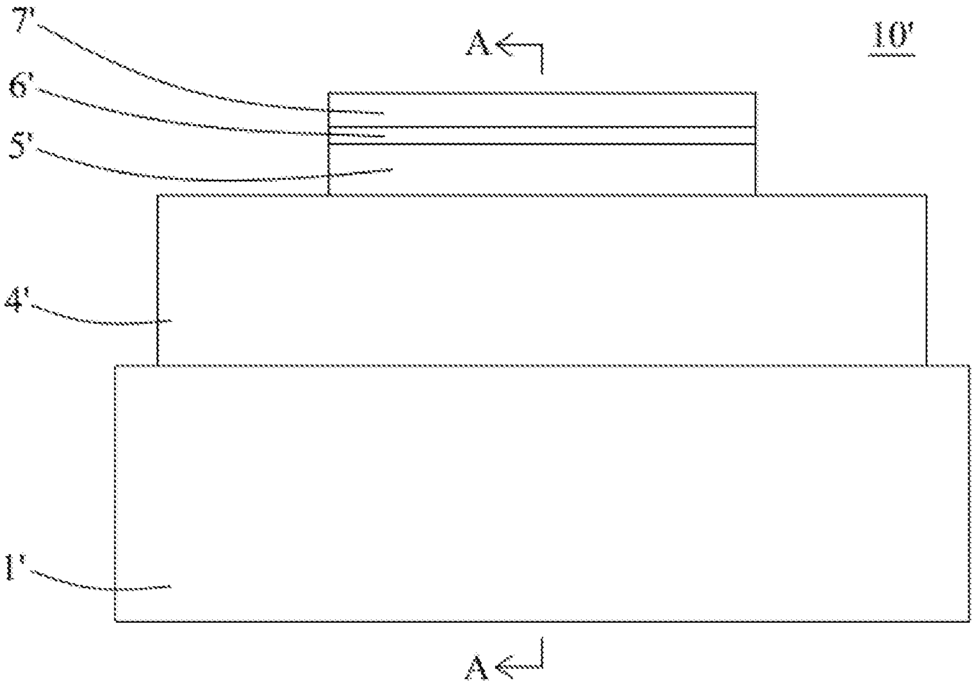
FIG. 1 is a schematic structural view of a FBAR in the conventional art.

| Reference numerals: | | | |
|---|---|---|---|
| 10' | FBAR, | 1' | substrate, |
| 2' | acoustic reflector, | 3' | first electrode, |
| 4' | piezoelectric layer, | 5' | second electrode, |
| 6' | etch-stop layer, | 7' | mass load layer, |
| α' | first region, | β' | second region, |
| γ' | third region, | 10 | FBAR, |
| 1 | substrate, | 2 | acoustic reflector, |
| 3 | first electrode, | 4 | piezoelectric layer, |
| 5 | second electrode, | 6 | etch-stop layer, |
| 7 | mass load layer, | 7a | extension structure, |
| 71 | first mass load layer, | 6 | second mass load layer, |
| 8 | insertion layer, | 81 | first insertion layer, |
| 82 | second insertion layer, | α | first region, |
| β | second region, | γ | third region, |
| θ | fourth region, | Δ | fifth region. |

The accompanying drawings here are incorporated into the specification and form a part of this specification, and the accompanying drawings show embodiments in accordance with the present invention and used together with the specification to explain the principle of the present invention.

DETAILED DESCRIPTION

In order to better understand the technical solution of the present invention, a detailed description of the embodiments of the present invention will be provided below in conjunction with the accompanying drawings.

It should be clarified that the described embodiments are only a part of the embodiments of the present invention, not all of them. Based on the embodiments in the present invention, all other embodiments obtained by ordinary technical personnel in this field without creative labor fall within the scope of protection in the present invention.

The terms used in the embodiments of the present invention are only for the purpose of describing specific embodiments, and are not intended to limit the present invention. The singular forms of "one", "said", and "the" used in the embodiments of the present invention and the accompanying claims may also intended to include the majority form, unless the context clearly indicates otherwise.

It should be understood that the term "and/or" used herein is only a description of the association relationship between related objects, indicating that there can be three types of relationships, such as A and/or B, which can represent the three situations: the existence of A alone, the existence of A and B simultaneously, and the existence of B alone. In addition, the character '/' in this specification generally indicates that the associated objects has an 'or' relationship.

It should be noted that the directional words "up", "down", "left", "right", etc. described in the embodiments of the present invention are described from the perspective shown in the attached drawings and should not be understood as limiting the embodiments of the present invention. In addition, in the context, it should be understood that when referring to a component being connected "up" or "down" to another component, it can not only be directly connected to another component "up" or "down", but also indirectly connected to another component "up" or "down" through intermediate components.

Figure 2:
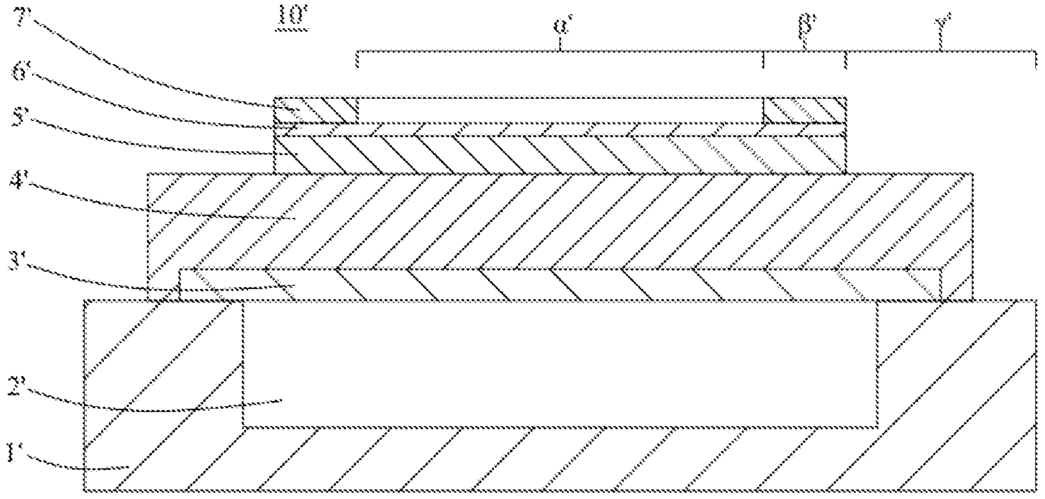
FIG. 2 is a cross-sectional view of the FBAR shown in FIG. 1 along direction A.

Reference is made to FIG. 1 to FIG. 2. The FBAR 10' in the conventional art includes a substrate 1', an acoustic reflector 2', a first electrode 3', a piezoelectric layer 4', a second electrode 5', an etch-stop layer 6', and a mass load layer 7'. The acoustic reflector 2' is a cavity formed on a side of the substrate 1'. The first electrode 3' is arranged on the side of the substrate 1' and covers the acoustic reflector 2'. At least a part of the piezoelectric layer 4' is arranged on a side of the first electrode 3' away from the substrate 1', the second electrode 5' is arranged a side of the piezoelectric layer 4' away from the first electrode 3', and the etch-stop layer 6' is arranged on a side of the second electrode 5' away from the piezoelectric layer 4'. The mass load layer 7' is arranged on a side of the etch-stop layer 6' away from the second electrode 5'. An effective source region of the FBAR 10' is formed by an overlapping region of the first electrode 3', the piezoelectric layer 4', the second electrode 5', and the etch-stop layer 6'. The effective source region includes a first region α' And a second region β'. Both sides of the first region α' are adjacent to the second region β'. FIG. 2 shows that only one side of the first region is adjacent to the second region β'. And the first region α'. Compared to the first region α', a part of the mass load layer 7' located in the second region β' has higher acoustic impedance. The mass load layer 7' increases the discontinuity in acoustic impedance between the effective source region and non-effective source region (third region γ'), so that at least a part of the transverse RL wave propagating from the effective source region (first region α' and the second region β') to the non-effective source region (third region γ') is reflected at the boundary between the effective source region (first region α' and the second region β') and the non-effective source region (third region γ') back to the effective source region (first region α' and the second region β'). In response to the width dimension along the direction X of the mass load layer 7' being equal to an odd multiple of one fourth of the wavelength of the transverse RL wave in specific modes (e.g., S0 mode, A0 mode, S1 mode, and A1 mode), the reflection efficiency is higher, that is, energy leakage from the effective source region (first region α' and the second region β') to the non-effective source region (third region γ') is minimal, resulting in a higher Q value of the FBAR 10'. A higher Q value indicates a slower rate of energy loss and a longer duration of vibration. In the subsequent content of this specification, Q value is used to represent the quality factor. Specifically, the transverse RL wave mode is a vibration mode formed by the superposition of longitudinal vibration and shear vibration. The transverse RL wave mainly includes four modes: symmetric mode S0, symmetric mode S1, antisymmetric mode A0, and antisymmetric mode A1. At a specific resonant frequency, each mode corresponds to a different number of waves, which means that the wavelengths in each mode are different. The mass load layer 7' with a single width size generally only reflects transverse wave energy in one mode (generally S1 mode). In the conventional art, the mass load layer 7' of the FBAR 10 has one width, and the numerical value can only correspond to an odd number times of a quarter of the wavelength of a certain mode, that is, the wave energy of other modes cannot be reflected, and the wave energy of other modes will still leak. Therefore, the Q value of the FBAR 10' in the conventional art is low.

To solve the above technical problems, a FBAR is provided according to the embodiments of the present invention. As shown in FIG. 3 to FIG. 17, the FBAR 10 includes a substrate 1, an acoustic reflector 2, a first electrode 3, a piezoelectric layer 4, a second electrode 5, and an etch-stop layer 6. The acoustic reflector 2 is arranged on the substrate 1, the first electrode 3 is arranged on a side of the substrate 1 and covers the acoustic reflector 2, and at least a part of the piezoelectric layer 4 is arranged on a side of the first electrode 3 away from the substrate 1. The second electrode 5 is arranged on a side of the piezoelectric layer 4 away from the first electrode 3, and the etch-stop layer 6 is arranged on a side of the second electrode 5 away from the piezoelectric layer 4. The FBAR 10 further includes at least two stacked components arranged on a side of the etch-stop layer 6 away from the second electrode 5, each of the at least two stacked components is a frame structure, and each of the at least two stacked components includes a mass load layer 7 and an insertion layer 8 stacked sequentially. As shown in FIG. 5, FIG. 8, FIG. 11, FIG. 14 and FIG. 17, at least an edge of each of the at least two stacked components is misaligned along a direction X perpendicular to thickness direction Y of the FBAR 10.

In this embodiment of the present invention, referring to FIG. 3 to FIG. 17, an effective source region of the FBAR 10 is formed by an overlapping region of the first electrode 3, the piezoelectric layer 4, the second electrode 5, and the etch-stop layer 6 along the direction X perpendicular to thickness direction Y of the FBAR 10, which includes the first region α and the second region β. Both sides of the first region α is adjacent to the second region β. To facilitate a clear understanding of the accompanying drawings, the first region α shown in FIG. 5, FIG. 8, FIG. 11, FIG. 14, and FIG. 17 has only one side adjacent to the second region β. Specifically, the first region α is a region excluding the mass load layer 7, the second region β is a region including the overlapping region between the etch-stop layer 6 and the mass load layer 7 along the thickness direction. FIG. 5 is taken as an example, compared to the first region α, a part of the mass load layer 7 located in the second region β has higher acoustic impedance. The mass load layer 7' increases the discontinuity in acoustic impedance between the effective source region and non-effective source region (third region γ'), so that at least a part of the transverse RL wave propagating from the effective source region (first region α' and the second region β') to the non-effective source region (third region γ') is reflected at the boundary between the effective source region (first region α' and the second region β') and the non-effective source region (third region γ') back to the effective source region (first region α' and the second region β'). The FBAR 10 provided according to this embodiment of the present invention includes at least two stacked components, each of which includes a mass load layer 7 and an insertion layer 8 stacked sequentially. Along a direction perpendicular to the thickness direction Y of the FBAR 10, for example, along the direction X, at least an edge of each of the at least two stacked components is misaligned, such that the position distribution of the at least two mass load layers 7 includes three types of schemes.

The first type of scheme shown in FIG. 3 to FIG. 8 is that at least two layers of mass load layer 7 with different effective widths are located in the effective source region (the first region α and the second region β). In response to the effective width of one layer of mass load layer 7 being equal to an odd multiple of the wavelength of one mode in the S0 mode and S1 mode of the transverse RL wave, and the effective width of the other layer of mass load layer 7 being equal to an odd multiple of the wavelength of the other mode, the two layers of mass load layer 7 can efficiently reflect the energy of two different modes of waves in the second region β. By analogy, by increasing the number of layers of stacked components or increasing the number of layers of mass load layer 7, and making the effective width of the increased mass load layer 7 to be equal to an odd multiple of one-fourth of the wavelength of other modes, the types of waves in the effective source region (the first region α and the second region β) that can be reflected are further increased, that is, the energy leakage from the effective source region (the first region α and the second region β) to the non-effective source region (the third region γ) are further reduced, thereby increasing the Q value of the FBAR 10 in this embodiment of the present invention.

The second type of scheme shown in FIG. 9 to FIG. 14 is that at least one layer of mass load layer 7 is located in the effective source region (the first region α and the second region β), at least one layer of mass load layer 7 is within the non-effective source region, which is divided into a third region γ and the fourth region θ with discontinuous acoustic impedance by a part of the mass load layer 7. A suspension portion (extension structure 7*a*) of a part of the mass load layer 7 located in the third region γ has no obvious electrical response. In response to the width of at least a part (extension structure 7*a*) of the mass load layer 7 located in the third region γ being equal to an odd multiple of the wavelength of one of the antisymmetric A0 mode waves and the antisymmetric A1 mode waves of the transverse RL wave, the energy of one of the antisymmetric mode waves can be efficiently reflected. Taking into account the above, the FBAR 10 of this embodiment of the present invention can efficiently reflect one of S0 mode waves and S1 mode waves in the effective source region (the first region α and the second region β). Therefore, the FBAR 10 in this embodiment of the present invention has a higher reflection efficiency on the total transverse wave energy, i.e., a higher Q value.

Figure 15:
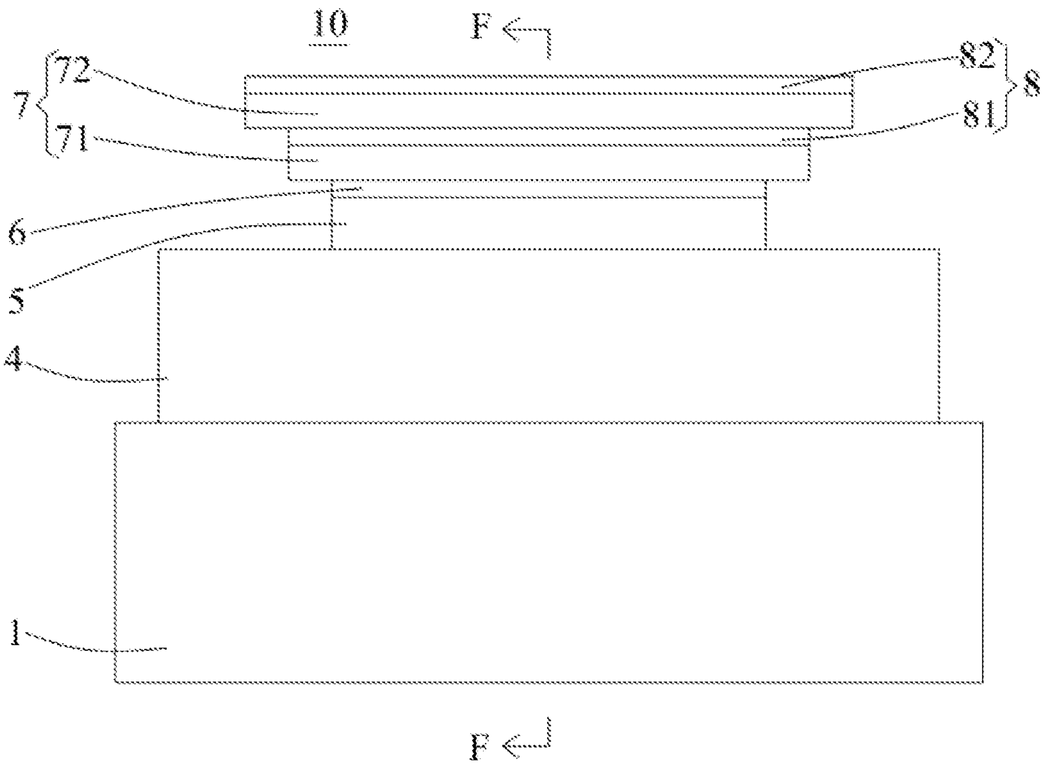
FIG. 15 is a schematic structural view of a FBAR provided according to a fifth embodiment of the present invention.
Figure 16:
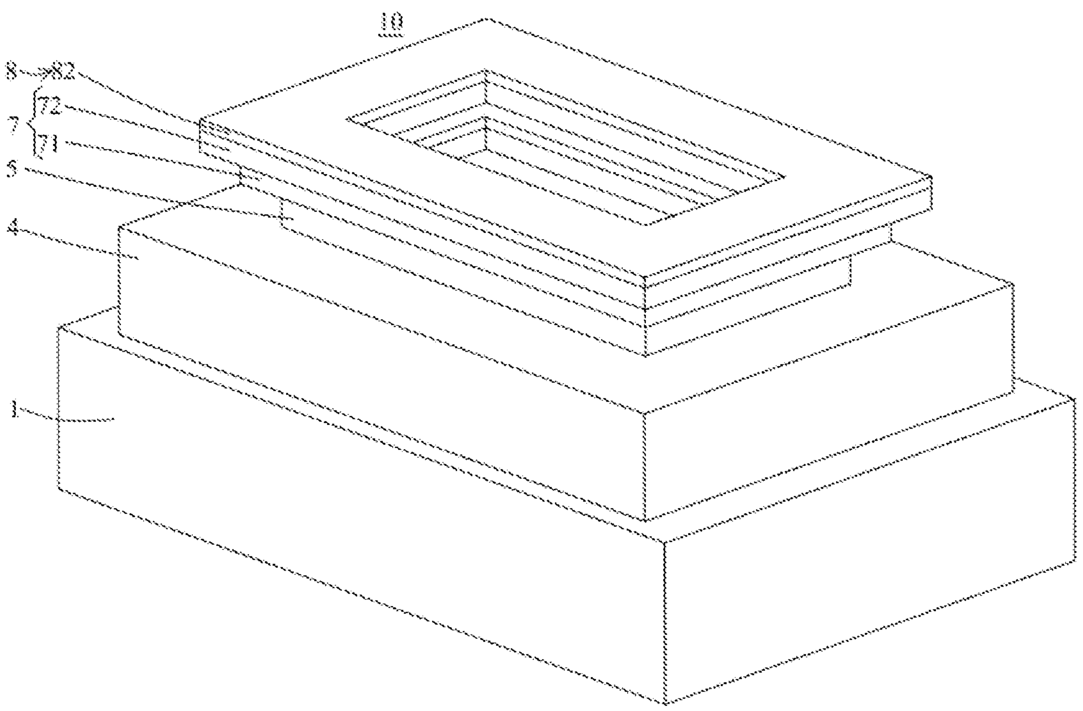
FIG. 16 is a three-dimensional view of the FBAR shown in FIG. 15.
Figure 17:
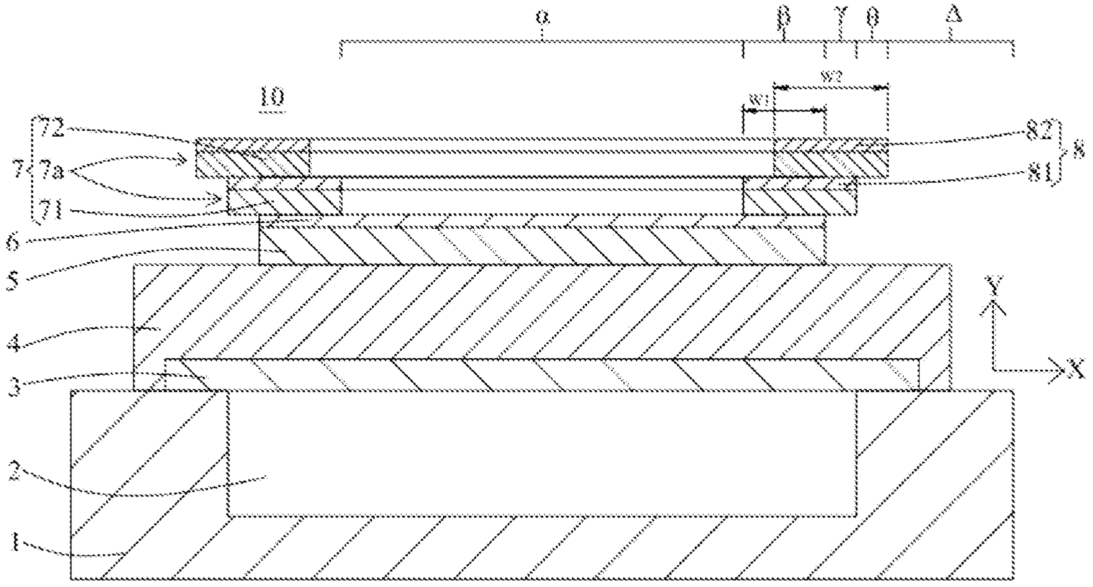
FIG. 17 is a cross-sectional view of the FBAR shown in FIG. 15 along direction F.

The third type of scheme shown in FIG. 15 to FIG. 17 is that at least two layers of mass load layer 7 are located within the non-effective source region and have different widths, resulting in the non-effective source region being divided into a third region γ, a fourth region θ, and a fifth region A with discontinuous acoustic impedance. A suspension portion (extension structure 7*a*) of a part of the mass load layer 7 located in the third region γ has no obvious electrical response, and a suspension portion (extension structure 7*a*) of a part of the mass load layer 7 located in the fourth region γ has no obvious electrical response. In response to the width of at least a part (extension structure 7*a*) of the mass load layer 7 located in the third region γ being equal to an odd multiple of the wavelength of one of the antisymmetric A0 mode waves and the antisymmetric A1 mode waves of the transverse RL wave, and the width of at least a part (extension structure 7*a*) of the mass load layer 7 located in the fourth region θ being equal to an odd multiple of the wavelength of the other of the antisymmetric A0 mode wave and the antisymmetric A1 mode wave of the transverse RL wave, the antisymmetric A0 mode wave and the antisymmetric A1 mode wave can be simultaneously reflected with high efficiency, further enhancing the reflection effect on the energy of the antisymmetric mode waves. Taking into account the above, the FBAR 10 of this embodiment of the present invention can efficiently reflect one of S0 mode waves and S1 mode waves in the effective source region (the first region α and the second region β). Therefore, the FBAR 10 in this embodiment of the present invention has a higher reflection efficiency on the total transverse wave energy, i.e., a higher Q value.

Referring to FIG. 5, FIG. 8, FIG. 11, FIG. 14, and FIG. 17, the insertion layer 8 serves as an etching protection layer to make each layer of mass load layer 7 independent of each other, thereby ensuring the consistency of film thickness and shape dimensions of each layer of mass load layer 7.

In addition, the shape of the stacked components may specifically be rectangular, circular, elliptical, or hexagonal. Rectangular frame is taken as an example in the following embodiments of the present invention.

Possible structures of the FBAR 10 in the embodiments of the present invention will be described one by one in this specification.

Specifically, as shown in FIG. 5, FIG. 8, FIG. 11, FIG. 14, and FIG. 17, an effective source region of the FBAR 10 is formed by an overlapping region of the first electrode 3, the piezoelectric layer 4, the second electrode 5, and the etch-stop layer 6 along the direction X perpendicular to thickness direction Y of the FBAR. At least a part of the at least two stacked components is located within the effective source region, and are located close to an edge of the effective source region.

Figure 3:
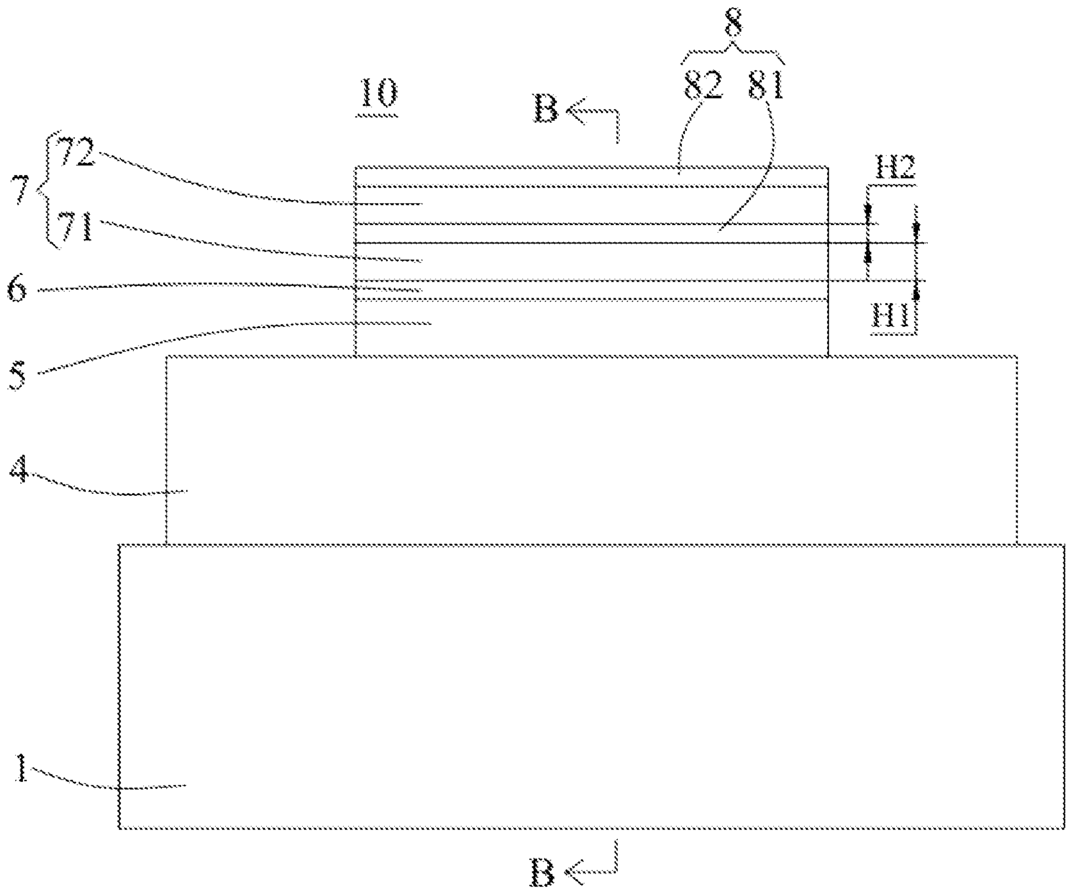
FIG. 3 is a schematic structural view of a FBAR provided according to a first embodiment of the present invention.
Figure 4:
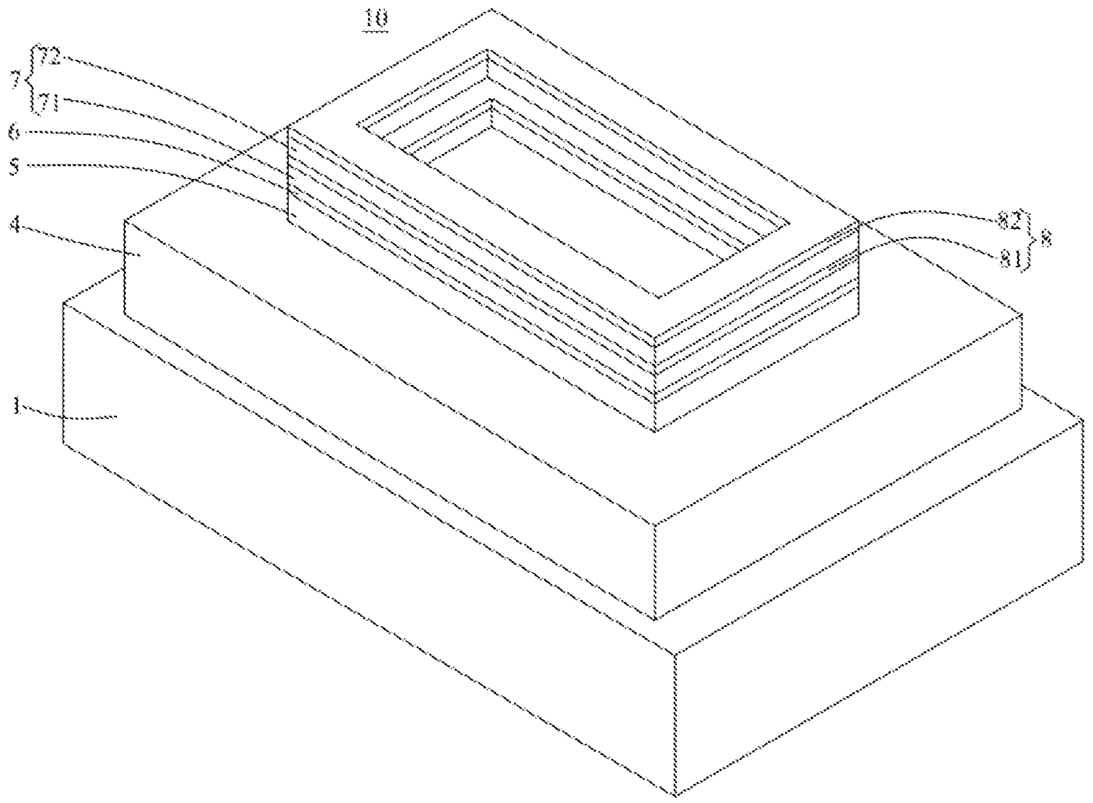
FIG. 4 is a three-dimensional view of the FBAR shown in FIG. 3.
Figure 5:
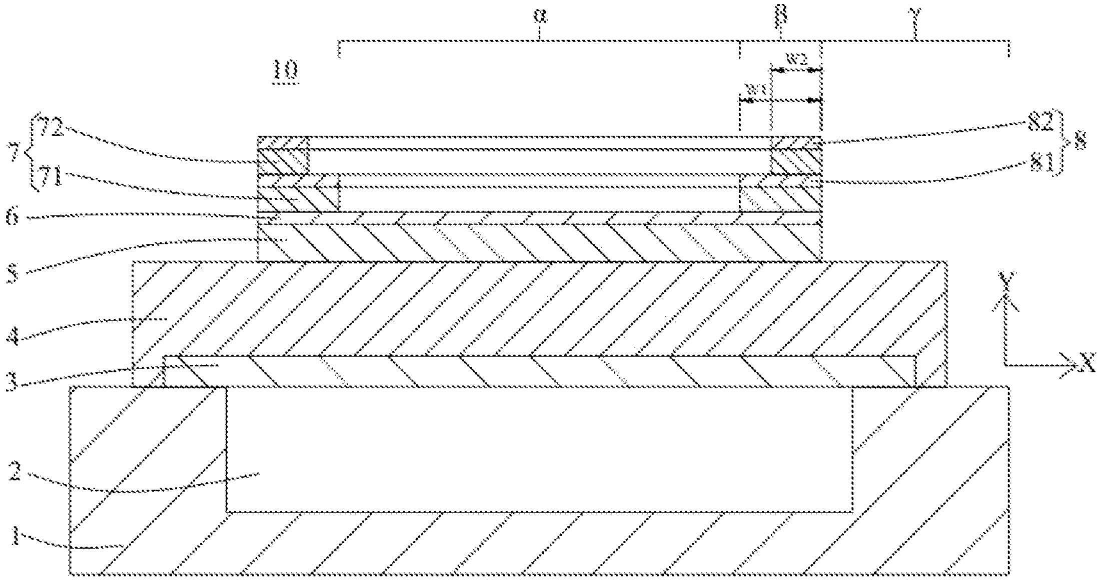
FIG. 5 is a cross-sectional view of the FBAR shown in FIG. 3 along direction B.

In the first embodiment, as shown in FIG. 3 to FIG. 5, the edges of the at least two stacked components can be aligned with the edges of the effective source region (the first region α and the second region β), edges at the other side of edge of the at least two stacked components aligned with the effective source region are misaligned. In this way, at least two layers of mass load layer 7 are entirely located in the second region β, that is, the at least two layers of mass load layer 7 entirely provide resonance, and the effective widths of the at least two layers of mass load layer 7 are different, which can reflect at least two different modes of wave energy. By analogy, by increasing the number of the mass load layers that are entirely located in the second region β and having edges aligned with the edges of the effective source region, and increasing width of the added mass load layer 7, other modes of wave energy can further be reflected. The FBAR 10 of this embodiment of the present invention can reflect at least two different mode wave energies compared to the FBAR in the conventional art, which further reduces the energy leakage from the effective source region (the first region α and the second region β) to the non-effective source region (the third region γ). Therefore, the FBAR 10 in this embodiment of this embodiment of the present invention has a higher Q value.

Reference is made to FIG. 3 to FIG. 5. Regarding the specific solution of the first embodiment, the FBAR 10 of the present invention includes a first mass load layer 71, a first insertion layer 81, a second mass load layer 72, and a second insertion layer 82 arranged and stacked in sequence. The first mass load layer 71 and the first insertion layer 81 form a first layer stacked component, and the second mass load layer 72 and the second insertion layer 82 form a second layer stacked component. The first mass load layer 71 has a set width W1 and is completely in the second region β, that is, the first mass load layer 71 is a resonant part as a whole, and the width W1 is the effective width of the first mass load layer 71. The second mass load layer 72 has a set width W2 and is completely in the second region β, the second mass load layer 72 is a resonant part as a whole, and the width W2 is the effective width of the second mass load layer 72. The width W1 is greater than the width W2. In response to the width W1 and the width W2 being equal to odd times the wavelength of different modes, respectively, the first mass load layer 71 and the second mass load layer 72 can efficiently reflect the energy of two different mode waves (e.g., S0 mode wave and S1 mode wave).

Correspondingly, as shown in FIG. 5, the width of the first insertion layer 81 is set to be the same as the width W1 of the first mass load layer 71, and the width of the second insertion layer 82 is set to be the same as the width W2 of the second mass load layer 72.

Figure 6:
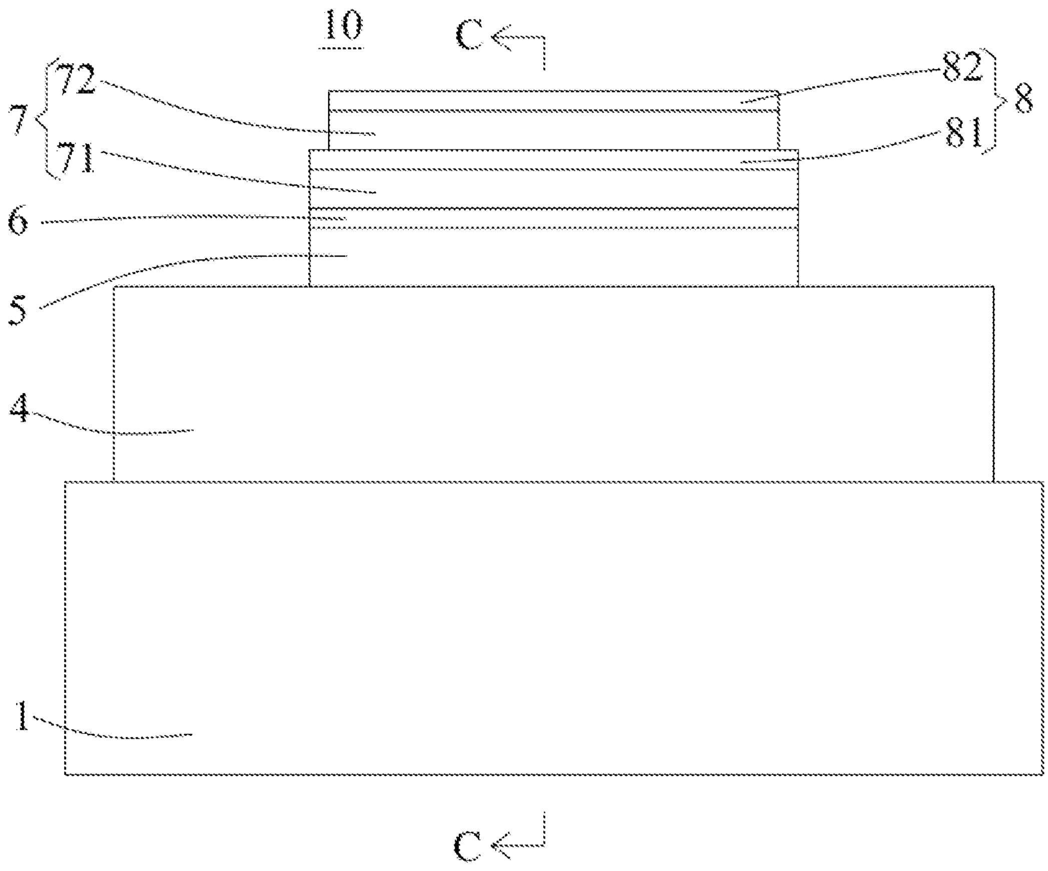
FIG. 6 is a schematic structural view of a FBAR provided according to a second embodiment of the present invention.
Figure 7:
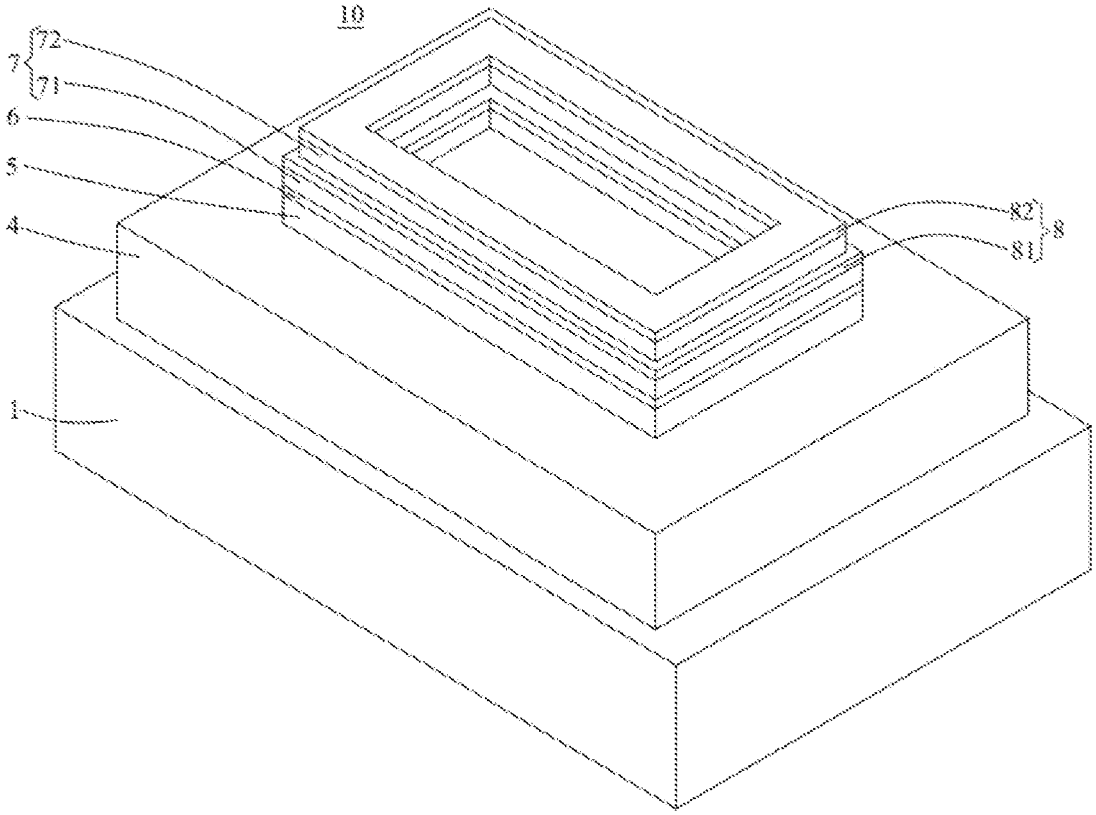
FIG. 7 is a three-dimensional view of the FBAR shown in FIG. 6.
Figure 8:
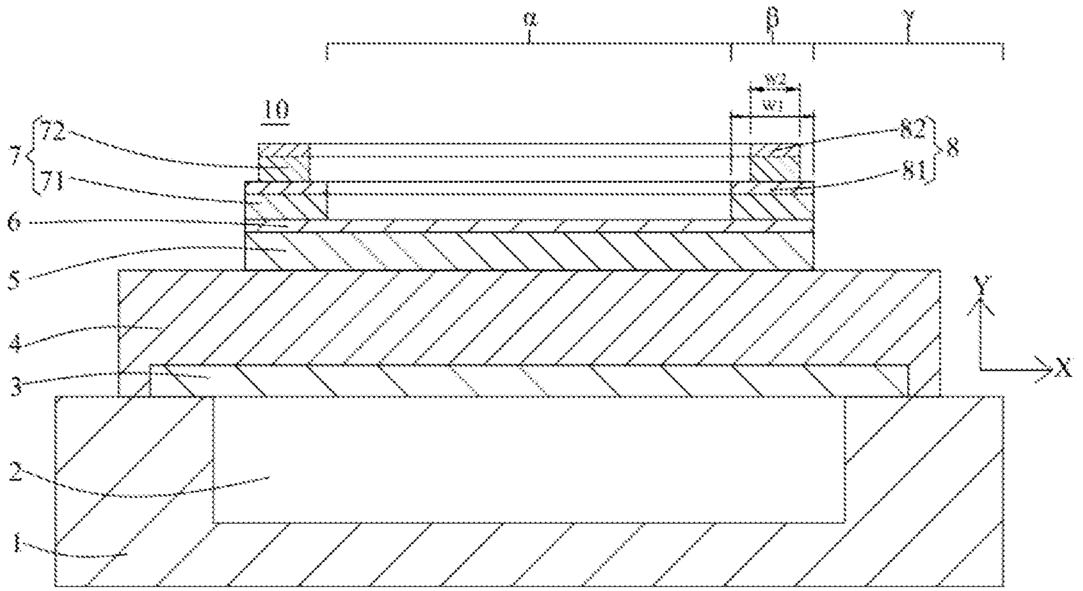
FIG. 8 is a cross-sectional view of the FBAR shown in FIG. 6 along direction C.

In the second embodiment, as shown in FIG. 6 to FIG. 8, the inner edges and the outer edges of at least two mass load layers 7 are misaligned. In this way, one of the outer edges of at least two mass load layers 7 described is flush with the edge of the etch-stop layer 6, and the other of the outer edges of at least two mass load layers 7 is located within the edge of the etch-stop layer 6, so that at least two layers of mass load layer 7 are entirely located in the second region β. That is, the at least two layers of mass load layer 7 entirely provide resonance, and the effective widths of the at least two layers of mass load layer 7 are different, which can reflect at least two different modes of wave energy. By analogy, by increasing the number of the mass load layers that are entirely located in the second region β and having edges aligned with the edges of the effective source region, and increasing width of the added mass load layer 7, other modes of wave energy can further be reflected. The FBAR 10 of this embodiment of the present invention can reflect at least two different mode wave energies compared to the FBAR in the conventional art, which further reduces the energy leakage from the effective source region (the first region α and the second region β) to the non-effective source region (the third region γ). Therefore, the FBAR 10 in this embodiment of this embodiment of the present invention has a higher Q value.

Referring to the specific scheme of the second embodiment shown in FIG. 6 to FIG. 8, the FBAR 10 of this embodiment of the present invention includes a first mass load layer 71, a first insertion layer 81, a second mass load layer 72, and a second insertion layer 82 arranged and stacked in sequence. The first mass load layer 71 and the first insertion layer 81 form a first layer stacked component, and the second mass load layer 72 and the second insertion layer 82 form a second layer stacked component. The first mass load layer 71 has a set width W1 and is completely in the second region β, that is, the first mass load layer 71 is a resonant part as a whole, and the width W1 is the effective width of the first mass load layer 71. The second mass load layer 72 has a set width W2 and is completely in the second region β, the second mass load layer 72 is a resonant part as a whole, and the width W2 is the effective width of the second mass load layer 72. The width W1 is greater than the width W2. In response to the width W1 and the width W2 being equal to odd times the wavelength of different modes, respectively, the first mass load layer 71 and the second mass load layer 72 can efficiently reflect the energy of two different mode waves (e.g., S0 mode wave and S1 mode wave).

Figure 11:
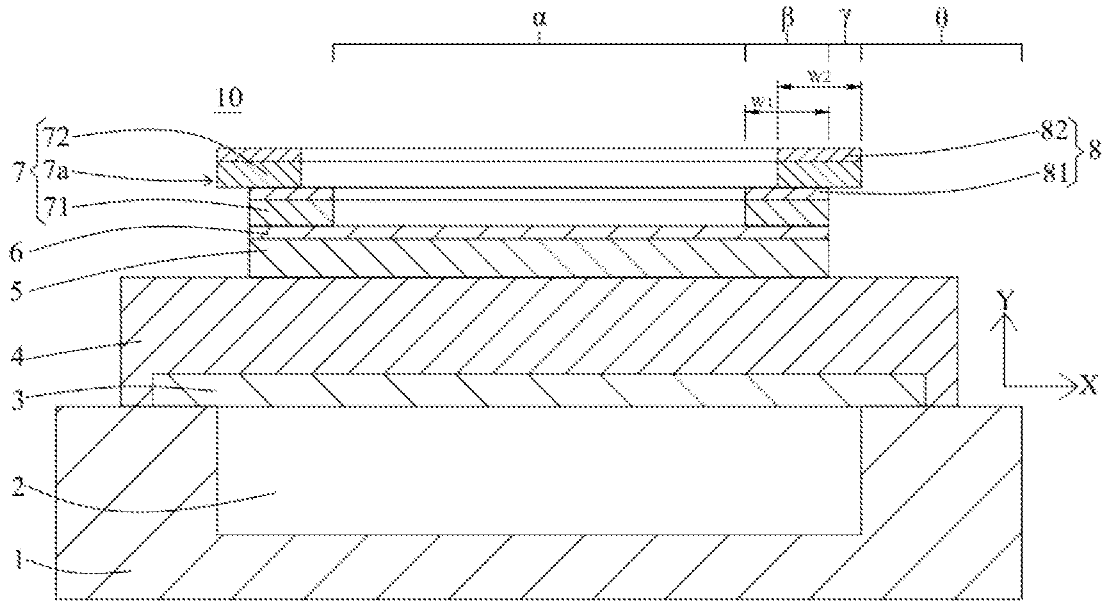
FIG. 11 is a cross-sectional view of the FBAR shown in FIG. 9 along direction D.
Figure 14:
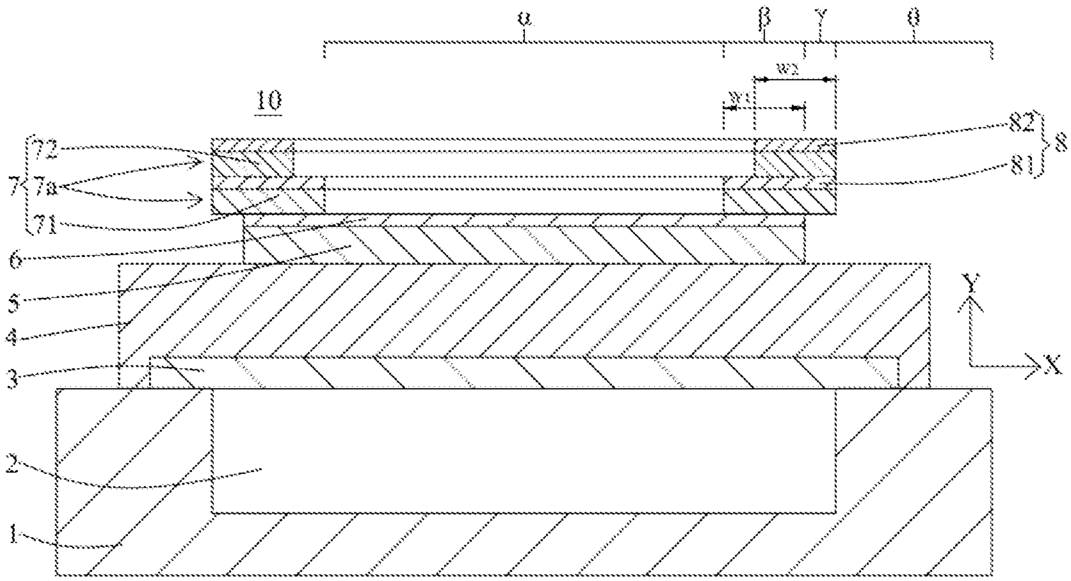
FIG. 14 is a cross-sectional view of the FBAR shown in FIG. 12 along direction E.

Correspondingly, the width of the first insertion layer 81 is set to be the same as the width W1 of the first mass load layer 71, and the width of the second insertion layer 82 is set to be the same as the width W2 of the second mass load layer 72. Referring to FIG. 11, FIG. 14, and FIG. 17, at least one layer in the stacked components further includes an extension structure **7*a* extending along a direction X perpendicular to the thickness direction Y of the FBAR 10 and at least partially located outside the effective source region, that is, the extension structure 7*a*** extends in the direction X.

Figure 9:
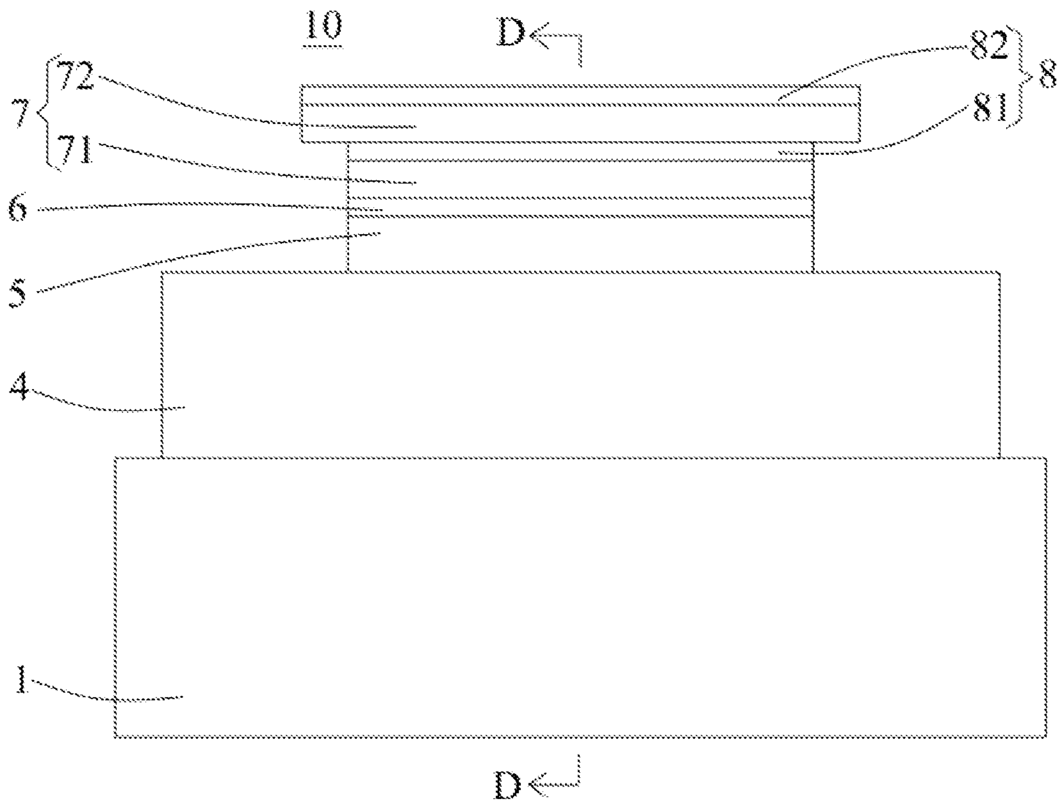
FIG. 9 is a schematic structural view of a FBAR provided according to a third embodiment of the present invention.
Figure 10:
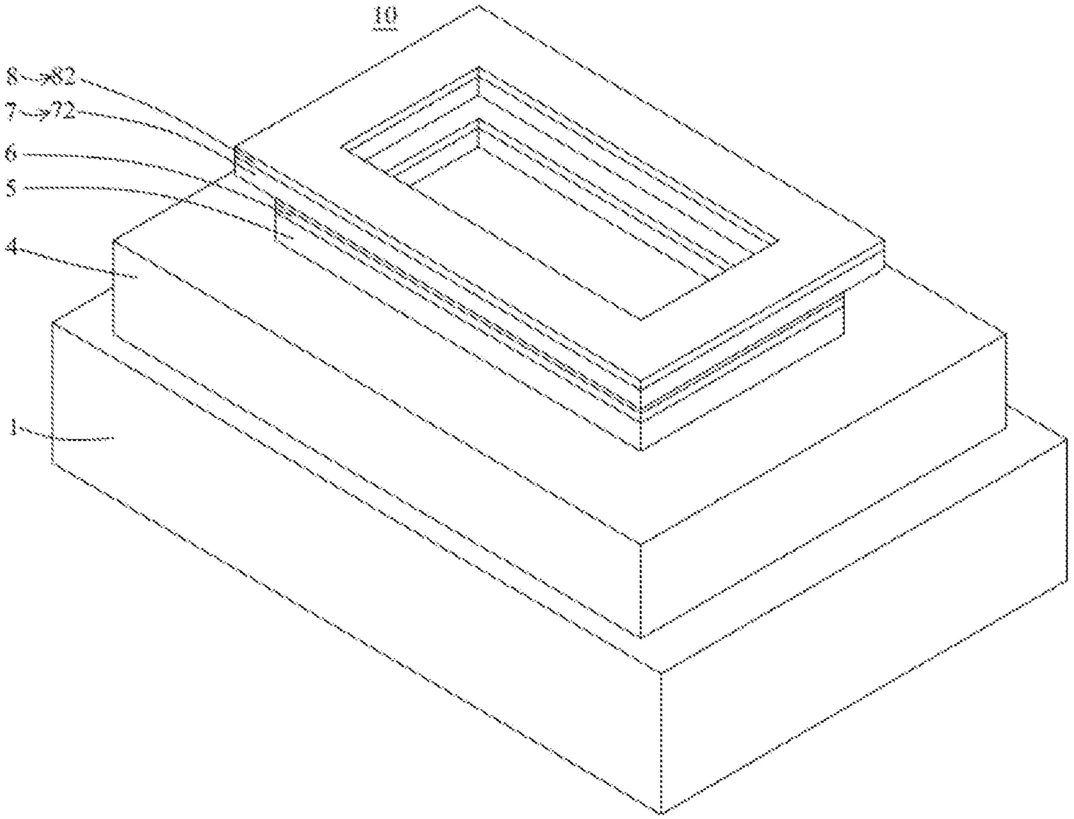
FIG. 10 is a three-dimensional view of the FBAR shown in FIG. 9.

In the third embodiment, as shown in FIG. 9 to FIG. 11, at least one layer of the stacked components is entirely located in the effective source region (the first region α and the second region β), a part of the at least one layer of the stacked components is located in the effective source region (the first region α and the second region β), and the other part the at least one layer of the stacked components is in the non-effective source region, that is, at least a part of the at least one layer of the mass load layer 7 is suspended relative to the etch-stop layer 6. In this way, the non-effective region is divided into a third region γ and the fourth region θ with discontinuous acoustic impedance. As shown in FIG. 11, a suspension portion (extension structure **7*a*) of a part of the mass load layer 7 located in the third region γ has no obvious electrical response. In response to the width of at least a part (extension structure 7***a*) of the mass load layer 7 located in the third region γ being equal to an odd multiple of the wavelength of one of the antisymmetric A0 mode waves and the antisymmetric A1 mode waves of the transverse RL wave, the energy of one of the antisymmetric mode waves can be efficiently reflected. Taking into account the above, the FBAR 10 of this embodiment of the present invention can increase the number of types of waves that can be reflected in the effective source region (the first region α and the second region β). Therefore, the FBAR 10 in this embodiment of the present invention has a higher reflection efficiency on the total transverse wave energy, i.e., a higher Q value.

Referring to the specific scheme of the third embodiment shown in FIG. 9 to FIG. 11, the FBAR 10 of this embodiment of the present invention includes a first mass load layer 71, a first insertion layer 81, a second mass load layer 72, and a second insertion layer 82 arranged and stacked in sequence. The first mass load layer 71 and the first insertion layer 81 form a first layer stacked component, and the second mass load layer 72 and the second insertion layer 82 form a second layer stacked component. The first mass load layer 71 has a set width W1 and is completely in the second region β, that is, the first mass load layer 71 is a resonant part as a whole, and the width W1 is the effective width of the first mass load layer 71. The second mass load layer 72 has a set width W2, a part of the second mass load layer 72 is located within the second region β, and the other part (extension portion 7*a*) of the second mass load layer 72 is located within the third region γ, so that the part of the second mass load layer 72 located within the second region β serves as the resonant part. Since the stacked components are frame shaped structures, and at least one edge of the at least two resonant parts is misaligned. Therefore, in FIG. 11, the inner edges of the first mass load layer 71 is misaligned with the inner edges of the second mass load layer 72, resulting in a smaller effective width of the resonant part of the second mass load layer 72 compared to the effective width W1 of the first mass load layer 71. Therefore, by setting the effective widths, the first mass load layer 71 and the second mass load layer 72 can reflect synergistically two different modes of wave energy (such as symmetric mode wave S0 and symmetric mode wave S1) in the second region β. Most of the transverse sound energy is reflected into the effective source region and converted into a piston sound wave mode perpendicular to the surface of piezoelectric layer 4. The other part of the second mass load layer 72 (extension structure 7*a*) located in the third region γ has no obvious electrical response. By setting the width of the extension structure 7*a*, one of the antisymmetric A0 mode wave and the antisymmetric A1 mode wave can be efficiently reflected.

In addition, as shown in FIG. 11, the width W1 of the first mass load layer 71 and the width W2 of the second mass load layer 72 can be the same. Correspondingly, the width W1 of the first insertion layer 81 can be set to be the same as the width W1 of the first mass load layer 7, and the width W2 of the second insertion layer 82 can be set to be the same as the width W2 of the second mass load layer 72.

Figure 12:
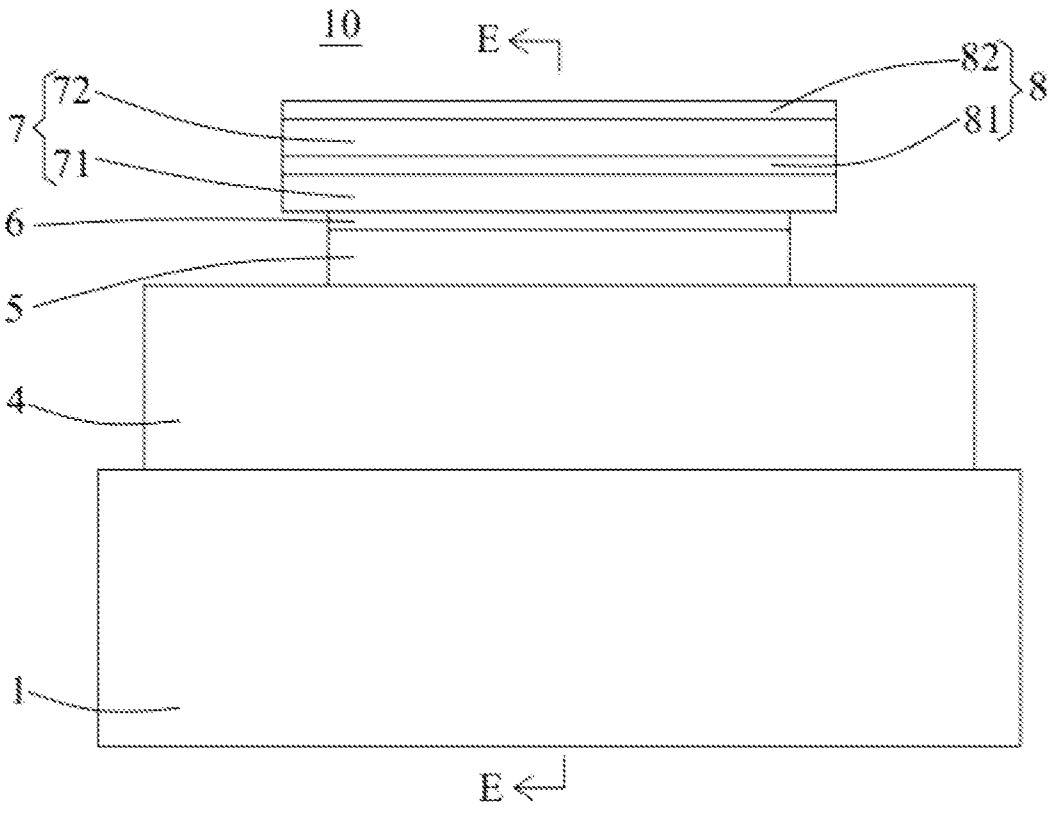
FIG. 12 is a schematic structural view of a FBAR provided according to a fourth embodiment of the present invention.
Figure 13:
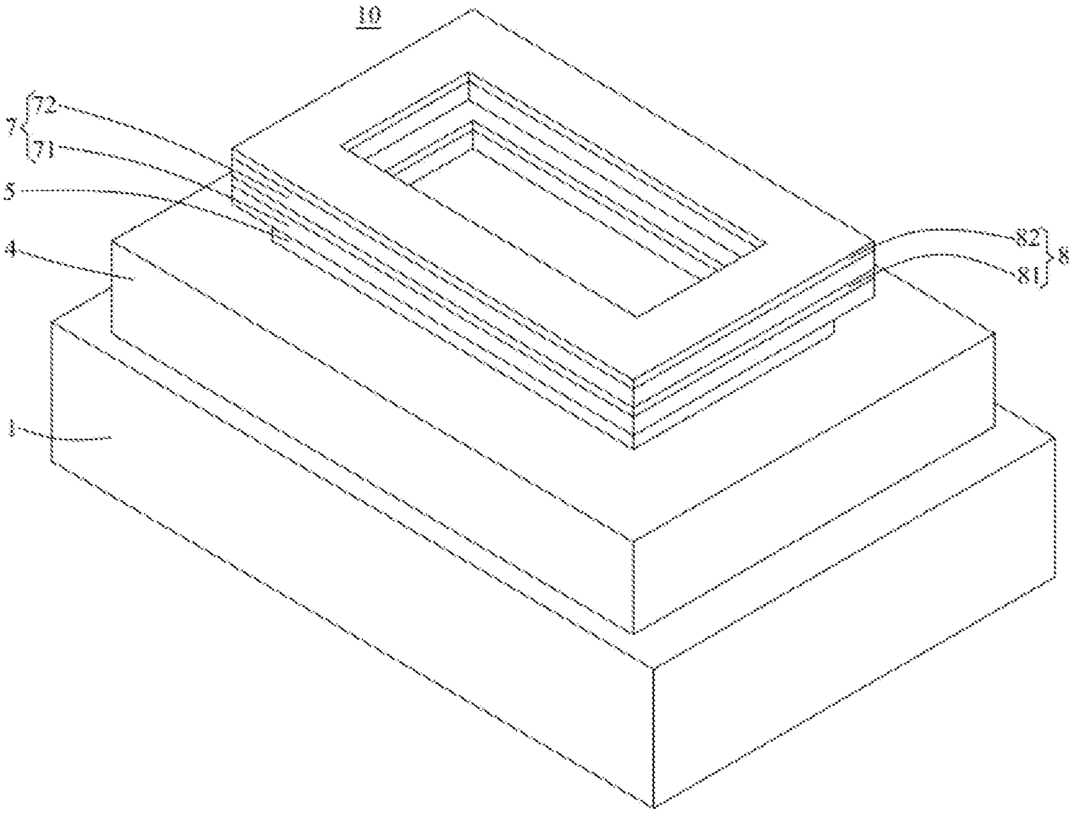
FIG. 13 is a three-dimensional view of the FBAR shown in FIG. 12.

Referring to the fourth embodiment shown in FIG. 12 to FIG. 14, at least a part (extension structure 7*a*) of the at least two layers of mass load layer 7 is suspended relative to the etch-stop layer 6, and the outer edges of the extension structure 7*a* are aligned with the edges of the etch-stop layer 6, resulting in the non effective source region being divided into a third region γ and the fourth region θ with discontinuous acoustic impedance. As shown in FIG. 14, a suspension portion (extension structure 7*a*) of a part of the mass load layer 7 located in the third region γ has no obvious electrical response. In response to the width of at least a part (extension structure 7*a*) of the mass load layer 7 located in the third region γ being equal to an odd multiple of the wavelength of one of the antisymmetric A0 mode waves and the antisymmetric A1 mode waves of the transverse RL wave, the energy of one of the antisymmetric mode waves can be efficiently reflected. Taking into account the above, the FBAR 10 of this embodiment of the present invention can increase the number of types of waves that can be reflected in the effective source region (the first region α and the second region β). Therefore, the FBAR 10 in this embodiment of the present invention has a higher reflection efficiency on the total transverse wave energy, i.e., a higher Q value.

Referring to the specific scheme of the fourth embodiment shown in FIG. 12 to FIG. 14, the FBAR 10 of this embodiment of the present invention includes a first mass load layer 71, a first insertion layer 81, a second mass load layer 72, and a second insertion layer 82 arranged and stacked in sequence. The first mass load layer 71 and the first insertion layer 81 form a first layer stacked component, and the second mass load layer 72 and the second insertion layer 82 form a second layer stacked component. The first mass load layer 71 has a set width W1, a part of the first mass load layer 71 is located within the second region β, that is, the part of the first mass load layer 71 located within the second region β serves as the resonance part. The other part (extension portion 7*a*) of the first mass load layer 71 is located within the third region γ. The second mass load layer 72 has a set width W2, a part of the second mass load layer 72 is located within the second region β, and the other part (extension portion 7*a*) of the second mass load layer 72 is located within the third region γ, so that the part of the second mass load layer 72 located within the second region β serves as the resonant part. Since the inner edges of the first mass load layer 71 is misaligned with the inner edges of the second mass load layer 72, the effective width of the resonant part of the first mass load layer 71 is different from the effective width of the second mass load layer 72. Therefore, by setting the effective widths, the first mass load layer 71 and the second mass load layer 72 can reflect synergistically two different modes of wave energy (e.g., symmetric mode wave S0 and symmetric mode wave S1) in the second region β. Most of the transverse sound energy is reflected into the effective source region and converted into a piston sound wave mode perpendicular to the surface of piezoelectric layer 4. The other part of the first mass load layer 71 (extension structure 7*a*) located in the third region γ and the other part of the second mass load layer 72 (extension structure 7*a*) located in the third region γ have same width and have no obvious electrical response. By setting widths of the other part of the first mass load layer 71 (extension structure 7*a*) located in the third region γ and the other part of the second mass load layer 72 (extension structure 7*a*) located in the third region γ, one of the antisymmetric A0 mode wave and the antisymmetric A1 mode wave can be efficiently reflected.

In addition, as shown in FIG. 14, the width W1 of the first mass load layer 71 and the width W2 of the second mass load layer 72 can be the same. Correspondingly, the width W1 of the first insertion layer 81 can be set to be the same as the width W1 of the first mass load layer 7, and the width W2 of the second insertion layer 82 can be set to be the same as the width W2 of the second mass load layer 72.

Specifically, referring to the fifth embodiment shown in FIG. 15 to FIG. 17, at least a part (extension structure 7*a*) of the at least two layers of mass load layer 7 is suspended relative to the etch-stop layer 6, and the outer edges of the extension structure 7*a* are misaligned with the edges of the etch-stop layer 6, resulting in the non effective source region being divided into a third region γ, a fourth region θ and a fifth region A with discontinuous acoustic impedance. As shown in FIG. 17, a suspension portion (extension structure 7*a*) of the part of the mass load layer 7 located in the third region γ has no obvious electrical response, and a suspension portion (extension structure 7*a*) of the part of the mass load layer 7 located in the fourth region θ has no obvious electrical response. In response to the width of at least a part (extension structure 7*a*) of the mass load layer 7 located in the third region γ being equal to an odd multiple of the wavelength of one of the antisymmetric A0 mode waves and the antisymmetric A1 mode waves of the transverse RL wave, and the width of at least a part (extension structure 7*a*) of the mass load layer 7 located in the fourth region θ being equal to an odd multiple of the wavelength of the other one of the antisymmetric A0 mode waves and the antisymmetric A1 mode waves of the transverse RL wave, the energy of the antisymmetric A0 mode wave and the antisymmetric A1 mode wave can be reflected efficiently and simultaneously, which further enhance the reflection effect of antisymmetric mode wave energy. Taking into account the above, the FBAR 10 of this embodiment of the present invention can increase the number of types of waves that can be reflected in the effective source region (the first region α and the second region). Therefore, the FBAR 10 in this embodiment of the present invention has a higher reflection efficiency on the total transverse wave energy, i.e., a higher Q value.

Referring to the specific scheme of the fourth embodiment shown in FIG. 15 to FIG. 17, the FBAR 10 of this embodiment of the present invention includes a first mass load layer 71, a first insertion layer 81, a second mass load layer 72, and a second insertion layer 82 arranged and stacked in sequence. The first mass load layer 71 and the first insertion layer 81 form a first layer stacked component, and the second mass load layer 72 and the second insertion layer 82 form a second layer stacked component. The first mass load layer 71 has a set width W1, a part of the first mass load layer 71 is located within the second region β, that is, the part of the first mass load layer 71 located within the second region β serves as the resonance part. The other part (extension portion 7*a*) of the first mass load layer 71 is located within the third region γ. The second mass load layer 72 has a set width W2, a first part of the second mass load layer 72 is located within the second region β, a second part of the second mass load layer 72 is located within the third region γ, and a third part of the second mass load layer 72 is located within the fourth region θ. The second part and the third part form an extension portion 7*a* of the second mass load layer 72. Since the inner edges of the first mass load layer 71 is misaligned with the inner edges of the second mass load layer 72, the effective width of the resonant part of the first mass load layer 71 is different from the effective width of the second mass load layer 72. Therefore, by setting the effective widths, the first mass load layer 71 and the second mass load layer 72 can reflect synergistically two different modes of wave energy (e.g., symmetric mode wave S0 and symmetric mode wave S1) in the second region β. Most of the transverse sound energy is reflected into the effective source region and converted into a piston sound wave mode perpendicular to the surface of piezoelectric layer 4. The part (extension structure 7*a*) of the first mass load layer 71 located in the third region γ, the second part (extension structure 7*a*) of the second mass load layer 72 located in the third region γ, and the third part (extension structure 7*a*) of the second mass load layer 72 located in the fourth region θ have no obvious electrical response. By setting widths of the extension portion 7*a* located in the third region γ and the fourth region θ, the antisymmetric A0 mode wave and the antisymmetric A1 mode wave can be reflected efficiently and simultaneously.

In addition, as shown in FIG. 14, the width W1 of the first mass load layer 71 and the width W2 of the second mass load layer 72 can be the same. Correspondingly, the width W1 of the first insertion layer 81 can be set to be the same as the width W1 of the first mass load layer 7, and the width W2 of the second insertion layer 82 can be set to be the same as the width W2 of the second mass load layer 72.

In the above embodiments, the width of the mass load layer 7 along the thickness direction Y perpendicular to the film bulk acoustic resonator ranges from 0.5 μm to 8 μm.

Along the thickness direction Y of the FBAR 10, the thickness of the insertion layer 8 ranges from 0.01 μm to 0.2 μm.

In the above embodiments, referring to FIG. 5, FIG. 8, FIG. 11, FIG. 14, and FIG. 17, The mass load layer 7 has greater acoustic impedance than the insertion layer 8, and the mass load layer 7 and the insertion layer 8 within the stacked component are stacked alternatively to form a Bragg reflection structure, which can further constrain the acoustic energy and increase the Q value.

Referring to FIG. 5, FIG. 8, FIG. 11, FIG. 14, and FIG. 17, the stacked components include a first mass load layer 71, a first insertion layer 81, a second mass load layer 72, and a second insertion layer 82 that are sequentially stacked. The acoustic impedance of the first mass load layer 71 is greater than that of the first insertion layer 81, and the acoustic impedance of the second mass load layer 72 is greater than that of the second insertion layer 82. The acoustic impedance of the first mass load layer 71 and the acoustic impedance of the second mass load layer 72 may be the same, and the acoustic impedance of the first insertion layer 81 and the acoustic impedance of the second insertion layer 82 may be the same.

Specifically, as shown in FIG. 5, the mass load layer 7 has a set height H1, and the insertion layer 8 has a set height H2. The height H1 is greater than the height H2, thus achieving the setting of the sound impedance of the mass load layer 7 being greater than the sound impedance of the insertion layer 8, to form a Bragg reflection structure that can further constrain the sound energy and increase the Q value.

As shown in FIG. 5, the first mass load layer 71 has a set height H1, the first insertion layer 81 has a set height H2, and the height H1 is greater than the height H2. The second mass load layer has the same height as the first mass load layer 72, and the second insertion layer 82 has the same height as the first insertion layer 81.

In other embodiments, the material of the mass load layer 7 and the material of the insertion layer 8 can also be changed to change the respective acoustic impedance values. In the above embodiments, referring to FIG. 5, FIG. 8, FIG. 11, FIG. 14, and FIG. 17, the acoustic reflector 2 is a cavity formed on the side of the substrate 1 close to the first electrode 3, and the acoustic reflector 2 is configured to reflect sound waves.

In other embodiments (not shown in the figure), the acoustic reflector 2 is a cavity formed inside the substrate 1, and the acoustic reflector 2 is configured to reflect sound waves.

Specifically, along the thickness direction Y of the FBAR 10, a projection of the first electrode 3 on the substrate 1 is at least partially located outside the cavity (acoustic reflector 2), and a projection of the second electrode 5 on the substrate 1 is within the cavity (acoustic reflector 2), which enables a projection of the effective source region (the first region $\alpha$ and the second region $\beta$) can be located within the cavity (acoustic reflector 2), so that the cavity has a larger reflection range and better reflection effect of sound waves.

In the above embodiments, the material of the mass load layer 7 is a metallic material including at least one of aluminum (Al), molybdenum (Mo), tungsten (W), and ruthenium (Ru), all of which can be used to produce the required mass load layer 7. The material of the insertion layer 8 is a dielectric material including at least one of aluminum nitride (AlN) and silicon nitride (Si3N4), all of which can be used to produce the required insertion layer 8.

Figure 18:
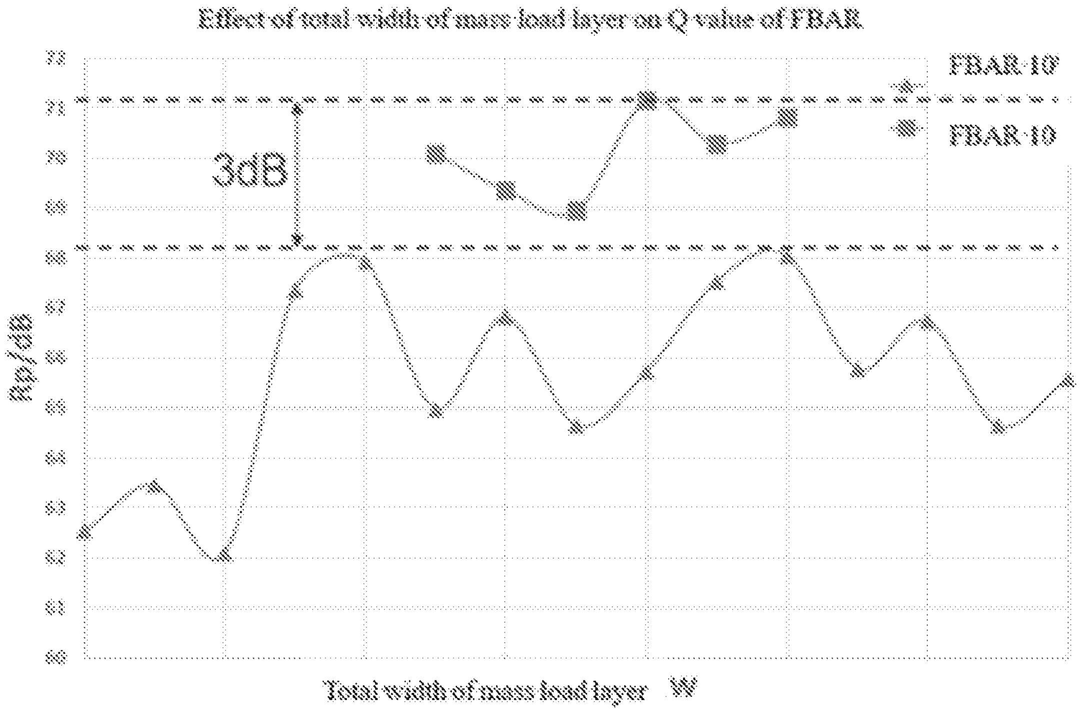
FIG. 18 is a comparison diagram of Q values between the FBAR shown in FIG. 3 and the FBAR shown in FIG. 1.

A comparative test was conducted on the FBAR 10 (the present invention) in the first embodiment shown in FIG. 3 to FIG. 5 and the FBAR 10' (conventional art). As shown in FIG. 18, the magnitude of the Rp value can characterize the magnitude of the Q value of the FBAR. The comparison condition is that the height of the mass load layer 7' of the FBAR 10' is consistent with the height of the stacked components of the present invention structure (the first mass load layer 71, the first insertion layer 81, the second mass load layer 72, and the second insertion layer 82), and the total width of the mass load layer 7' of the FBAR 10' is the same as the width of a single mass load layer. The total width of the mass load layer 7 of the FBAR 10 in the present invention is the sum of the total widths of the first mass load layer 71 and the second mass load layer 72. As shown in FIG. 18, both the FBAR 10' and the FBAR 10 have periodicity and extreme points. The maximum extreme point Rp in the FBAR 10 results in a significant increase of 3 dB compared to the extreme point Rp of the FBAR 10'. That is, the FBAR 10 provided according to the present invention has a higher reflection efficiency of sound waves under appropriate width conditions, which can bind more sound energy within the effective source region. Therefore, the Q value of the FBAR 10 provided according to the embodiments of the present invention is higher.

The above mentioned are only preferred embodiments of the present invention. It should be pointed out that for those of ordinary skills in the art, improvements may be made without departing from the inventive concept of the present invention, which shall all fall within the scope of protection of the present invention.

The invention claimed is:

1. A film bulk acoustic resonator (FBAR), comprising a substrate, an acoustic reflector, a first electrode, a piezoelectric layer, a second electrode, and an etch-stop layer, wherein the acoustic reflector is arranged on the substrate, the first electrode is arranged on a side of the substrate and covers the acoustic reflector, and at least a part of the piezoelectric layer is arranged on a side of the first electrode away from the substrate; the second electrode is arranged on a side of the piezoelectric layer away from the first electrode, and the etch-stop layer is arranged on a side of the second electrode away from the piezoelectric layer; wherein the FBAR further comprises at least two stacked components arranged on a side of the etch-stop layer away from the second electrode, each of the at least two stacked components is a frame structure, and each of the at least two stacked components comprises a mass load layer and an insertion layer stacked sequentially; at least an edge of each of the at least two stacked components is misaligned along a direction perpendicular to thickness direction of the FBAR.

2. The FBAR according to claim 1, wherein an effective source region of the FBAR is formed by an overlapping region of the first electrode, the piezoelectric layer, the second electrode, and the etch-stop layer along the direction perpendicular to thickness direction of the FBAR;

at least a part of the at least two stacked components is located within the effective source region, and are located close to an edge of the effective source region.

3. The FBAR according to claim 2, wherein at least one of the at least two stacked components further comprises an extension structure extending along the direction perpendicular to thickness direction of the FBAR and at least partially located outside the effective source region.

4. The FBAR according to claim 1, wherein widths of the at least two stacked components have a same width or have different widths along the direction perpendicular to thickness direction of the FBAR.

5. The FBAR according to claim 1, wherein a width of the mass load layer along the direction perpendicular to thickness direction of the FBAR ranges from 0.5 μm to 8 μm.

6. The FBAR according to claim 1, wherein a thickness of the insertion layer along the direction perpendicular to thickness direction of the FBAR ranges from 0.01 μm to 0.2 μm.

7. The FBAR according to claim 1, wherein the mass load layer has greater acoustic impedance than the insertion layer.

8. The FBAR according to claim 1, wherein the acoustic reflector is a cavity formed on a side of the substrate close to the first electrode, or the acoustic reflector is a cavity formed inside the substrate.

9. The FBAR according to claim 8, wherein a projection of the first electrode on the substrate is at least partially located outside the cavity along the direction perpendicular to thickness direction of the FBAR, the, and a projection of the second electrode on the substrate is located within the cavity.

10. The FBAR according to claim 1, wherein material of the mass load layer comprises at least one of aluminum (Al), molybdenum (Mo), tungsten (W), and ruthenium (Ru);

and/or, material of the insertion layer comprises at least one of aluminum nitride (AlN) and silicon nitride (Si3N4).

* * * * *